(12) United States Patent
Huang et al.

(10) Patent No.: US 9,082,934 B2
(45) Date of Patent: Jul. 14, 2015

(54) SEMICONDUCTOR OPTOELECTRONIC STRUCTURE WITH INCREASED LIGHT EXTRACTION EFFICIENCY

(71) Applicant: ADVANCED OPTOELECTRONIC TECHNOLOGY, INC.

(72) Inventors: Shih-Cheng Huang, Hsinchu (TW); Po-Min Tu, Hsinchu (TW); Peng-Yi Wu, Hsinchu (TW); Wen-Yu Lin, Hsinchu (TW); Chih-Pang Ma, Hsinchu (TW); Tzu-Chien Hong, Hsinchu (TW); Chia-Hui Shen, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/037,386

(22) Filed: Sep. 26, 2013

(65) Prior Publication Data

US 2014/0027806 A1   Jan. 30, 2014

Related U.S. Application Data

(62) Division of application No. 12/836,075, filed on Jul. 14, 2010, now Pat. No. 8,574,939.

(30) Foreign Application Priority Data

Jul. 15, 2009   (TW) .............................. 98123854 A

(51) Int. Cl.
| | |
|---|---|
| H01L 33/10 | (2010.01) |
| H01L 33/22 | (2010.01) |
| H01L 33/36 | (2010.01) |
| H01L 33/20 | (2010.01) |
| H01L 33/00 | (2010.01) |

(52) U.S. Cl.
CPC ............ *H01L 33/36* (2013.01); *H01L 33/0095* (2013.01); *H01L 33/10* (2013.01); *H01L 33/20* (2013.01); *H01L 33/22* (2013.01); *H01L 33/007* (2013.01)

(58) Field of Classification Search
None
See application file for complete search history.

(56) References Cited

U.S. PATENT DOCUMENTS

| | | | | |
|---|---|---|---|---|
| 6,455,340 | B1 * | 9/2002 | Chua et al. | 438/31 |
| 7,005,685 | B2 * | 2/2006 | Sakai et al. | 257/103 |
| 2001/0053618 | A1 * | 12/2001 | Kozaki et al. | 438/933 |

(Continued)

FOREIGN PATENT DOCUMENTS

| | | | |
|---|---|---|---|
| CN | 1490910 A | 4/2004 | |
| CN | 1280961 C | 10/2006 | |
| WO | WO-2009-039812 A1 * | 4/2009 | .............. H01L 33/00 |

*Primary Examiner* — Johannes P Mondt
(74) *Attorney, Agent, or Firm* — Novak Druce Connolly Bove + Quigg LLP

(57) ABSTRACT

A semiconductor optoelectronic structure with increased light extraction efficiency, includes a substrate; a buffer layer is formed on the substrate and includes a pattern having plural grooves formed adjacent to the substrate; a semiconductor layer is formed on the buffer layer and includes an n-type conductive layer formed on the buffer layer, an active layer formed on the n-type conductive layer, and a p-type conductive layer formed on the active layer; a transparent electrically conductive layer is formed on the semiconductor layer; a p-type electrode is formed on the transparent electrically conductive layer; and an n-type electrode is formed on the n-type conductive layer.

14 Claims, 13 Drawing Sheets

(56) References Cited

U.S. PATENT DOCUMENTS

| | | |
|---|---|---|
| 2004/0125839 A1 | 7/2004 | Lee et al. |
| 2006/0273333 A1* | 12/2006 | Wu et al. ......................... 257/94 |
| 2007/0153865 A1* | 7/2007 | Maeda et al. ............ 372/50.124 |
| 2009/0309126 A1* | 12/2009 | Okuno .......................... 257/103 |
| 2010/0230698 A1* | 9/2010 | Rode et al. ...................... 257/98 |

\* cited by examiner

SEMICONDUCTOR OPTOELECTRONIC STRUCTURE WITH INCREASED LIGHT EXTRACTION EFFICIENCY

CROSS-REFERENCE TO RELATED APPLICATIONS

This application is a divisional application of U.S. patent application Ser. No. 12/836,075, filed on Jul. 14, 2010, entitled "SEMICONDUCTOR OPTOELECTRONIC STRUCTURE WITH INCREASED LIGHT EXTRACTION EFFICIENCY AND FABRICATION METHOD THEREOF" which is assigned to the same assignee as the present application, and which is based on and claims priority from Taiwan Patent Application No. 098123854 filed in Taiwan on Jul. 15, 2009. The disclosures of patent application Ser. No. 12/836,075 and the Taiwan Patent Application are incorporated herein by reference in their entirety.

BACKGROUND

1. Technical Field

The present invention relates to a Group III nitride semiconductor optoelectronic structure and a fabrication method thereof, and relates more particularly to a semiconductor optoelectronic structure with increased light extraction efficiency and a fabrication method thereof.

2. Description of Related Art

Light generated by the active layer in a traditional light emitting diode structure cannot be completely emitted outside the light emitting diode structure because light may partially transmit in a lateral waveguide and be totally reflected in the light emitting diode structure. In addition, internal constituents such as an active layer, a buffer layer, defects of material, and metal electrodes may absorb a portion of the light. Thus, the light extraction efficiency of the traditional light emitting structure is low.

Using a GaN-based Group III nitride blue-and-white-emitting light emitting diode as an example, the critical angle at which total reflection occurs for a uniform interface between the GaN (gallium nitride) material with a refractive index of 2.5 and the air with a refractive index of 1 is calculated to be 23.5 degrees. Therefore, light emitted from the active layer of a GaN light emitting diode and incident on the interface at an angle greater than 23.5 degrees is completely reflected back to the active layer, and reflected within the active layer until the light is completely absorbed.

One method to reduce the amount of light undergoing total reflection within the active layer is to generate irregular or roughened structures on the active layer for scattering light. However, because the p-type GaN layer on the active layer is very thin, the dry etching depth and the impairment caused by plasma ions cannot be effectively controlled during the etching process. Other methods are to roughen the surface of a light emitting diode or the side surface of a cutting area for increasing the light extraction efficiency.

FIGS. 1A and 1B show a roughened structure on a surface of a light emitting diode disclosed in U.S. Pat. No. 6,441,403. Referring to FIG. 1A, the method provided by U.S. Pat. No. 6,441,403 forms an epitaxial layer 117 on a sapphire substrate 101. When a p-GaN layer 109 is formed, the temperature is lowered, the growth speed is adjusted, and the ratio of Group III element to Group V element is adjusted so that a rough surface is obtained. Next, an etch process is performed to expose the n-GaN layer 105 and to form a cutting area. An n-type electrode 113 and a p-type electrode 115 are separately formed on the p-GaN layer 109 and the n-GaN layer 105. Finally, a plurality of chips is obtained through a cutting process. Further, in the epitaxial layer 117 of FIG. 1B, the n-GaN layer 105 can be formed after the formation of the p-GaN layer 109. On the n-GaN layer 105, an n-GaN layer 111 having a rough surface can be formed. In the method, a single surface is roughened; although the light extraction efficiency can be improved, some light may still enter into the sapphire substrate 101 and be confined within the light emitting diode. Moreover, an electrode directly formed on a rough surface may cause a device driving voltage increase issue.

FIGS. 2A and 2B show a light emitting diode structure disclosed in U.S. Pat. No. 7,053,420. Referring to FIG. 2A, a concave and convex surface 203a is initially formed on a sapphire substrate 201. A buffer layer 205 with different refractive index can next be formed on the concave and convex surface 203a. A semiconductor layer 213, including an n-type conduction layer 207, a light-emitting layer 209, and a p-type conduction layer 211, is then formed on the buffer layer 205. Further, the difference between the structure of FIG. 2A and the structure of FIG. 2B is that the concave and convex surface 203b in the structure of FIG. 2B has a triangular wave shape. The patent teaches that one surface of the sapphire substrate is processed to form a concave and convex surface. Because the sapphire substrate has characteristics such as surface hardness, high thermal stability, and stable chemical properties, the processing of the sapphire substrate is difficult. In addition, nitride semiconductor has refractive index of 2.3, and a sapphire substrate has refractive index has refractive index of 1.8. The two differ in a value of 0.5. Consequently, a portion of light may enter into the sapphire substrate without being efficiently utilized.

FIGS. 3A to 3C and FIGS. 3A' to 3C' demonstrate a process method disclosed in a paper entitled "Improved luminance intensity of InGaN—GaN light-emitting diode by roughening both the p-GaN surface and the undoped-GaN surface," APPLIED PHYSICS LETTERS 89, 041116 (2006). The process method combines a surface-roughening technique, a wafer-bonding technique, and a laser lift-off technique to manufacture a light-emitting diode having two rough surfaces. Referring to FIG. 3C, the process method forms an epitaxial layer 311 on a sapphire substrate 301. Next, using inductively coupled plasma process, the method dry etches a p-GaN layer 307 to obtain a rough surface. Next, a transparent conduction layer 309 is formed on the rough surface of the p-GaN layer 307. Next, a p-type electrode 313 is formed on the transparent conduction layer 309, and an n-type electrode 315 is formed on an undoped GaN layer 305. Thereafter, a laser is applied to separate the sapphire substrate 301 from the epitaxial layer 311. The undoped GaN layer 305 is then wet etched, and an adhesive layer 303 is applied for bonding the epitaxial layer 311 and the sapphire substrate 301 together so that two rough surfaces are obtained. FIG. 3A shows a general light-emitting diode having no processed light output surface. FIG. 3B shows a light-emitting diode having a single rough surface. The light output surface perpendicular to the light-emitting direction is roughened. FIG. 3C shows a light-emitting diode having two rough surfaces. The light output surface of the p-GaN layer perpendicular to the light-emitting direction and the surface of the undoped GaN layer opposite to the light output surface are roughened.

Comparing the light extraction efficiency of the above three structures, FIG. 3A', corresponding to FIG. 3A, shows the behavior of photons in a general light-emitting diode. Due to the planar light output surface, photons incident at an angle greater than 23.5 degrees will be reflected back to the active layer so that the light extraction efficiency is low. FIG. 3B', corresponding to FIG. 3B, shows the behavior of photons in a light-emitting diode having a single rough surface. It can be seen that the rough surface does not limit the emission of photons to an angle below the critical angle of 23.5 degrees. Therefore, the light emitting efficiency can be improved. FIG. 3C', corresponding to FIG. 3C, shows the behavior of photons in a light-emitting diode having two rough surfaces. Roughening the surface of the undoped GaN layer can reflect photons so as to further improve the luminance intensity of the rough light output surface, to further improve the light extraction efficiency compared to that of the structure of FIG. 3B. Although the above method can improve the light extraction efficiency, the light-emitting diode needs two bonding steps, resulting in process stability and manufacturing yield issues.

Thus, the method of the present invention does not have the above-mentioned drawbacks, and can improve the light extraction efficiency of a light emitting diode. Further, the method of the present invention can reduce the intensity of defects in an epitaxial layer, thereby improving the quality of the epitaxial layer.

BRIEF DESCRIPTION OF THE DRAWINGS

The invention will be described according to the appended drawings in which.

DETAILED DESCRIPTION OF THE EMBODIMENTS

One aspect of the present invention suggests a semiconductor optoelectronic structure with increased light extraction efficiency and a fabrication method thereof. In order to thoroughly understand the present invention, detailed descriptions of method steps and components are provided below. Clearly, the implementation of the present invention is not limited to the specific details that are familiar to persons skilled in the art related to optoelectronic device process. On the other hand, components or method steps, which are well known, are not described in detail. A preferred embodiment of the present invention is described in detail as follows. However, in addition to the preferred detailed description, other embodiments can be broadly employed, and the scope of the present invention is not limited by any of the embodiments, but should be defined in accordance with the following claims and their equivalent.

One objective of the present invention is to improve the light extraction efficiency of a light emitting diode structure so as to increase the luminance intensity of the light emitting diode.

Another objective of the present invention is to reduce the intensity of defects in an epitaxial process, improving the epitaxial layer quality.

Figure 1A:
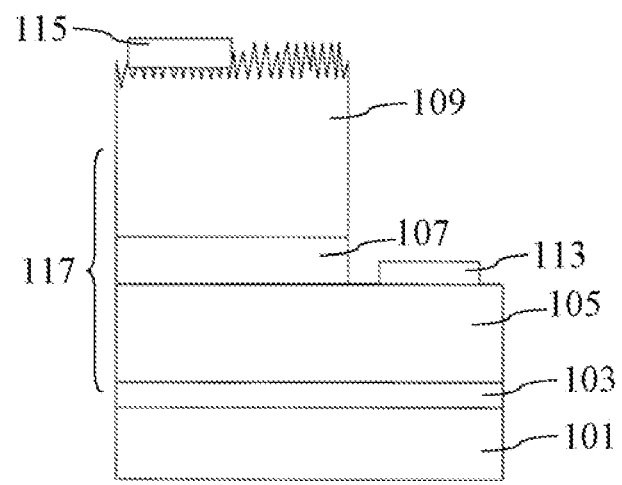
FIGS. 1A and 1B show a roughened structure on a surface of a light emitting diode disclosed in U.S. Pat. No. 6,441,403.
Figure 1B:
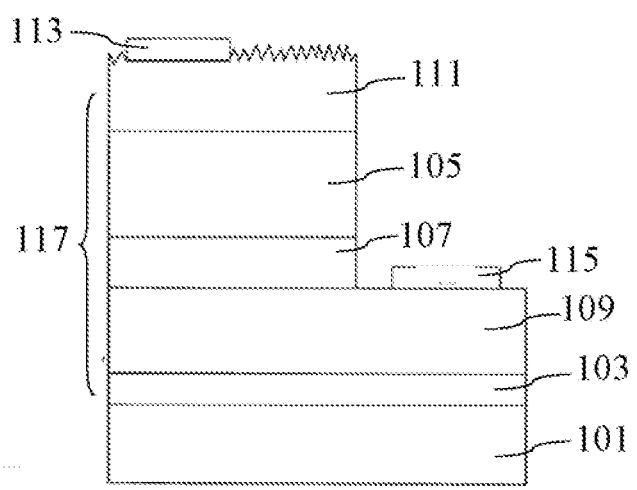
Figure 2A:
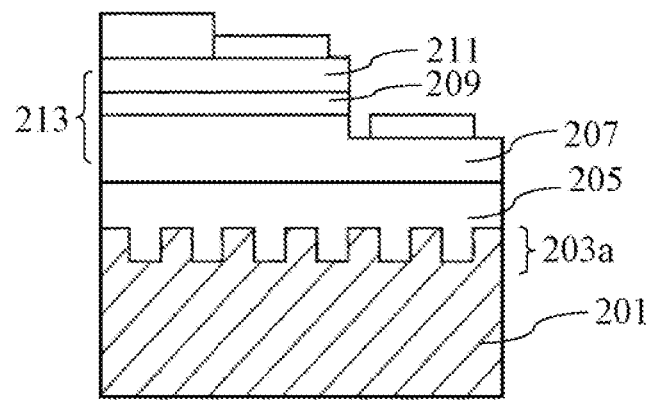
FIGS. 2A and 2B show a light emitting diode structure disclosed in U.S. Pat. No. 7,053,420.
Figure 2B:
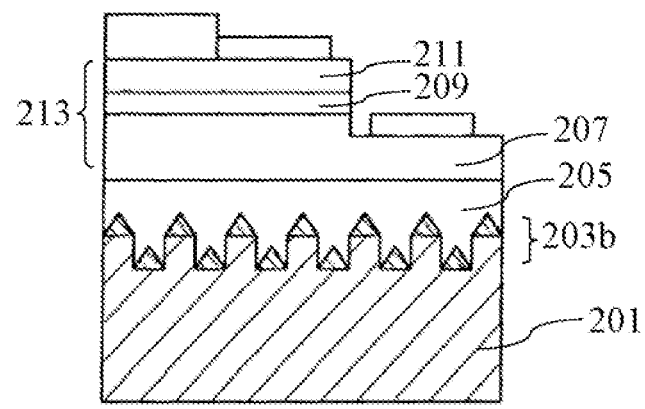
Figure 3A:
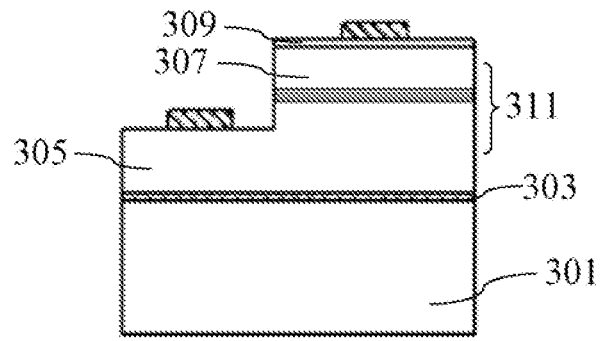
FIGS. 3A to 3C and FIGS. 3A' to 3C' demonstrate a process method disclosed in a paper entitled "Improved luminance intensity of InGaN—GaN light-emitting diode by roughening both the p-GaN surface and the undoped-GaN surface," APPLIED PHYSICS LETTERS 89, 041116 (2006)
Figure 3B:
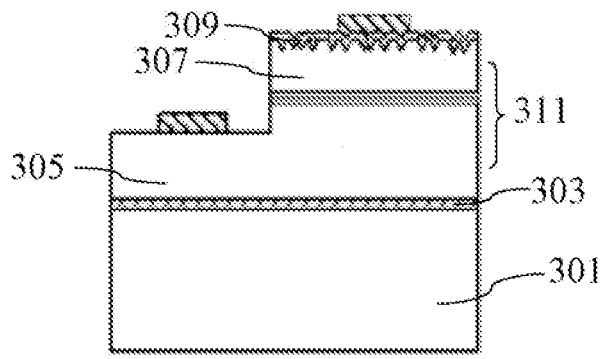
Figure 3C:
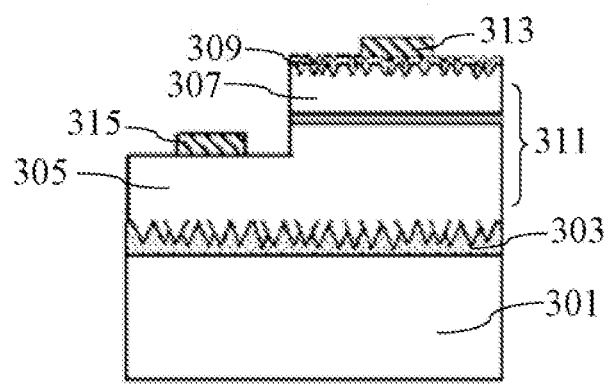
Figure 3A:
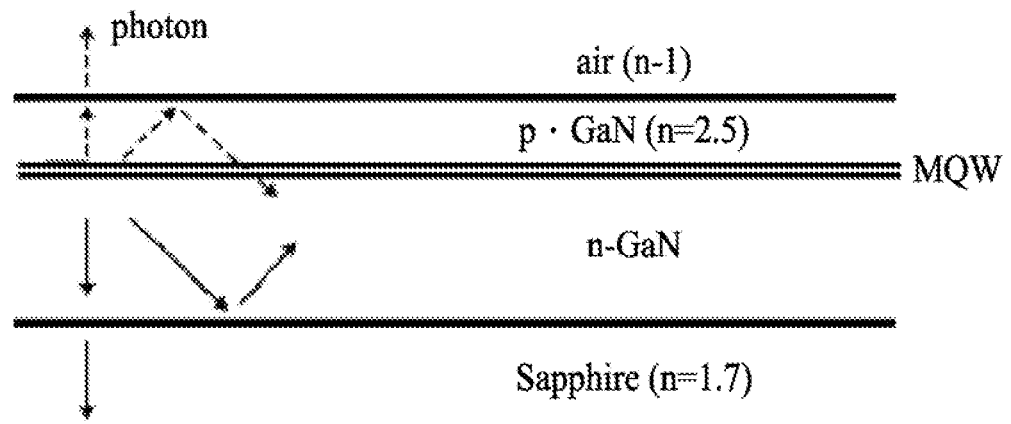
Figure 3B:
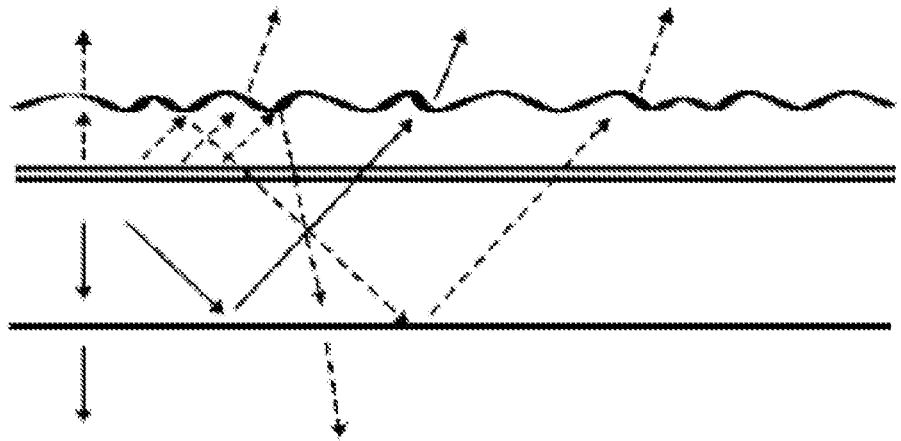
Figure 3C:
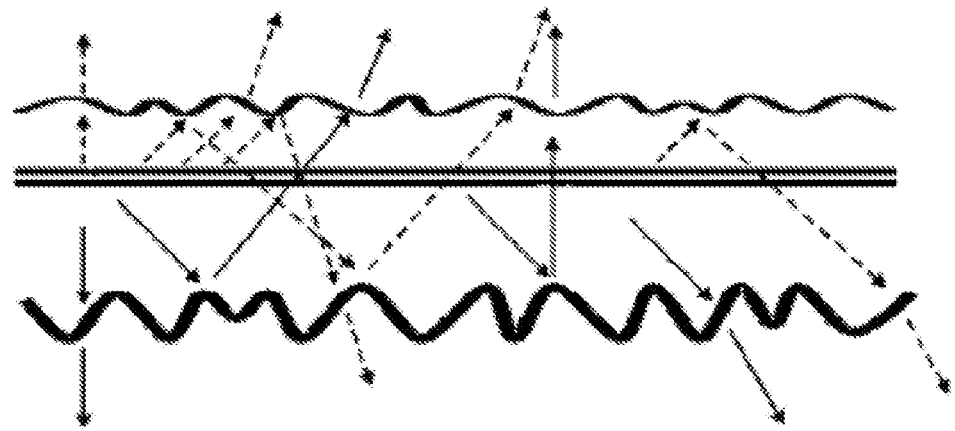
Figure 4:
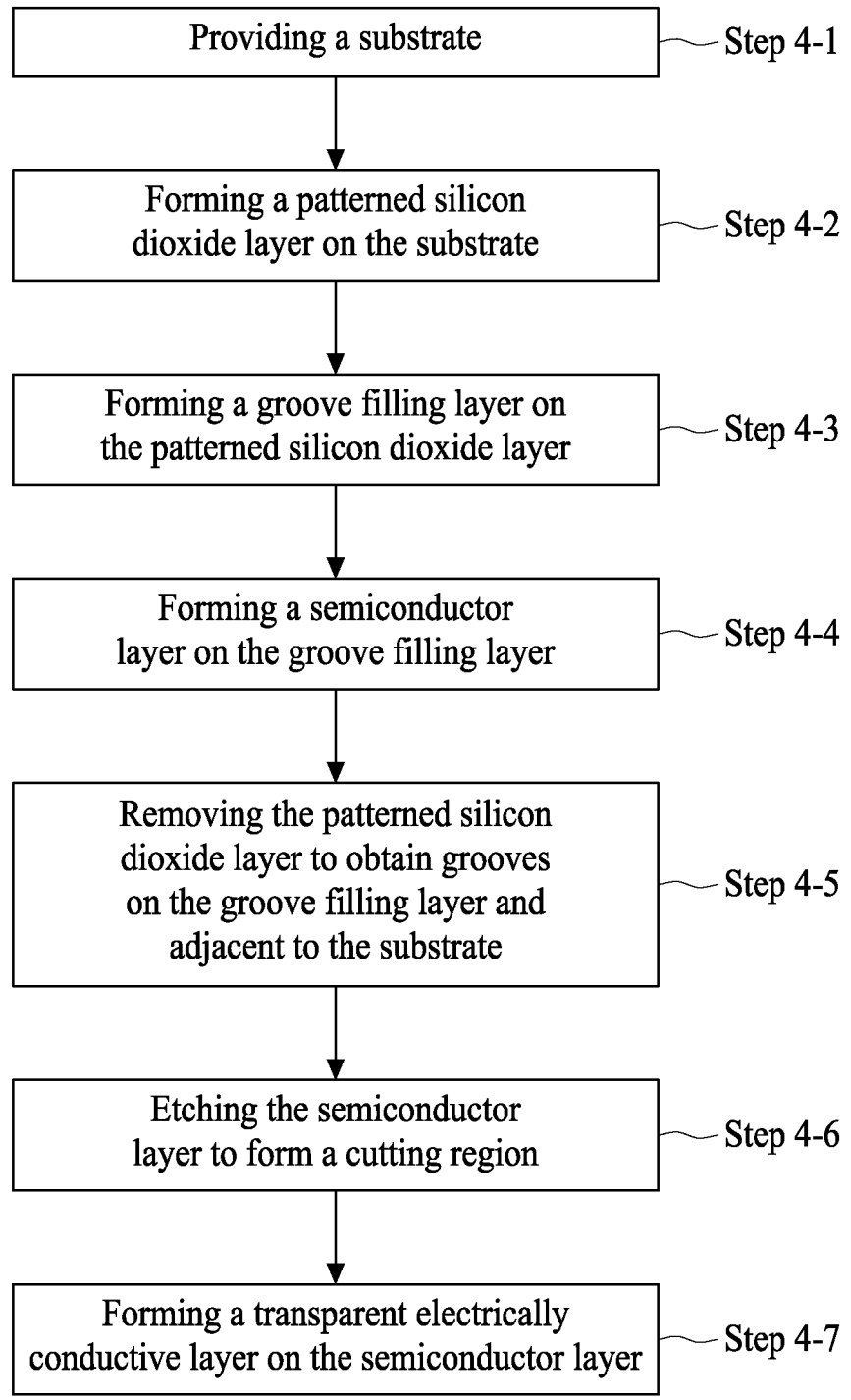
FIG. 4 is a flow chart showing the steps of a fabrication method according the first embodiment of the present invention.

FIG. 4 is a flow chart showing the steps of a first fabrication method according the first embodiment of the present invention. FIGS. 6A to 6E are cross-sectional views showing the corresponding steps of the first manufacturing method for a semiconductor optoelectronic structure with increased light extraction efficiency according to one embodiment of the present invention. As shown in Step 4-1 of FIG. 4 and FIG. 6A, a substrate 601 is initially provided. The substrate 601 can be a sapphire (Al2O3) substrate, a silicon carbide (SiC) substrate, a lithium aluminate (LiAlO2) substrate, a lithium gallates (LiGaO2) substrate, a silicon substrate, a gallium nitride (GaN) substrate, a zinc oxide (ZnO) substrate, an aluminum zinc oxide (AlZnO) substrate, a gallium arsenide (GaAs) substrate, a gallium phosphide (GaP) substrate, a gallium antimonide (GaSb) substrate, an indium phosphide (InP) substrate, an indium arsenide (InAs) substrate, or a zinc selenide (ZnSe) substrate, wherein the sapphire substrate is preferred. In addition, a cleaning process can be applied to clean the surfaces of a substrate 601. For example, the substrate 601 can be thermally cleaned in a hydrogen environment at a temperature of 1200 degrees.

Figure 6A:
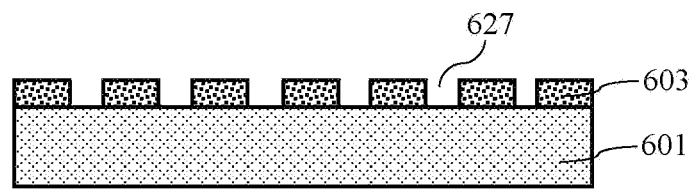
FIGS. 6A to 6G and 6F' to 6G' are cross-sectional views showing the steps of a first manufacturing method for a semiconductor optoelectronic structure with increased light extraction efficiency according to one embodiment of the present invention.

As shown in Step 4-2 of FIG. 4 and FIG. 6A, a patterned silicon dioxide layer is formed on the substrate 601. Silicon dioxide is initially deposited on the substrate 601 to form a thin film 603 using a chemical vapor deposition process or a low temperature sputtering deposition process. Next, a photoresist film is formed on the surface of the silicon dioxide layer 603. The photoresist film is patterned by photolithography to expose the portions to be etched. Finally, a wet etch, dry etch, or an etch method using inductively coupled plasma etcher is applied to obtain a patterned silicon dioxide layer 603.

Figure 10A:
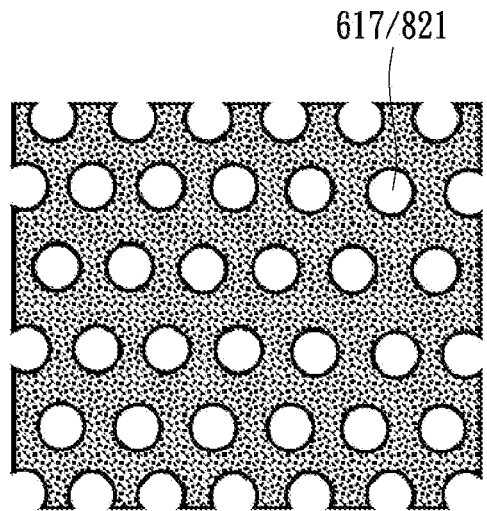
FIGS. 10A to 10D respectively demonstrate silicon dioxide layers having different patterns according to one embodiment of the present invention.
Figure 10B:
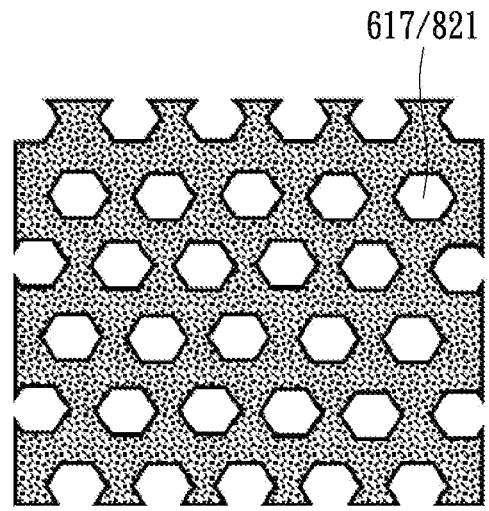
Figure 10C:
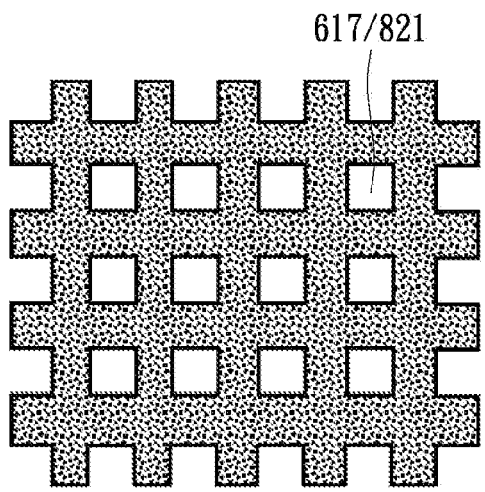
Figure 10D:
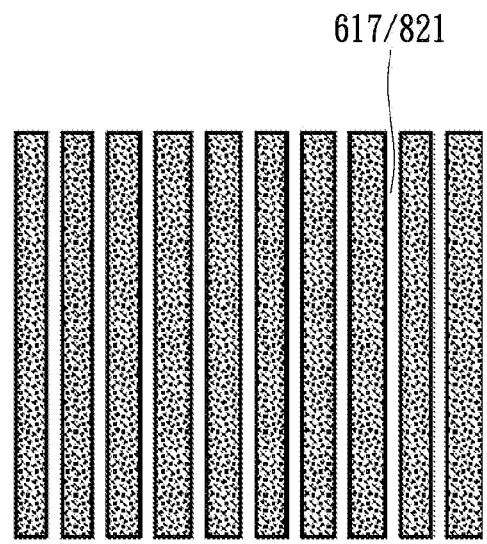

The patterned silicon dioxide layer 603 can be a continuous pattern or a partially continuous pattern as shown in FIGS. 10A to 10D respectively demonstrating silicon dioxide layers having different patterns. FIG. 10A shows plural cylindrical grooves. FIG. 10B shows plural hexagonal columnar grooves. FIG. 10C shows square prism-shaped grooves. FIG. 10D shows elongated grooves. In addition to the above-mentioned grooves, the grooves can be formed with other shapes. The patterns of FIGS. 10A to 10C are continuous, while the pattern of FIG. 10D is partially continuous.

Figure 6B:
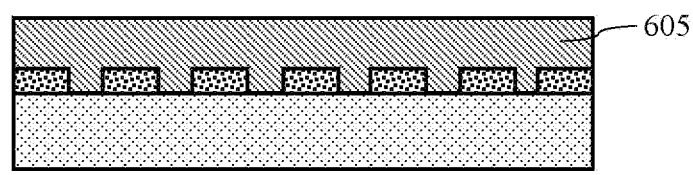

As shown in Step 4-3 of FIG. 4 and FIG. 6B, Group III nitride groove filling layer or a so-called buffer layer 605 is formed on the patterned silicon dioxide layer 603. Because the silicon dioxide is polycrystalline, the monocrystalline Group III nitride layer, the lattice of which is not matched to that of the silicon dioxide cannot be epitaxially grown directly on the silicon dioxide layer due to the epitaxially lateral overgrowth phenomenon. During an epitaxial process, discontinuous gaps may be formed between the Group III nitride layer and the silicon dioxide layer. When the Group III nitride material growing from cavities 627 reaches the surface of the silicon dioxide layer 603, the Group III material may grow laterally and join together to form a planar filling layer. The groove filling layer 605 can be a buffer layer for increasing the epitaxial quality of a semiconductor layer. In the present embodiment, the Group III groove filling layer 605 can be AlxInyGa1-x-yN where $0 \leq x \leq 1$ and $0 \leq y \leq 1$.

Figure 6C:
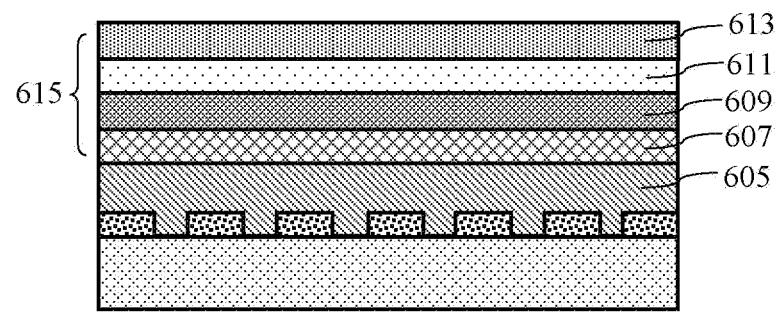

As shown in Step 4-4 of FIG. 4 and FIG. 6C, a semiconductor layer 615 is formed on the Group III nitride groove filling layer 605. The semiconductor layer 615 may comprise an n-type conductive layer 607, an active layer 609, an electron-blocking layer 611, and a p-type conductive layer 613. The semiconductor layer 615 can be deposited on the groove filling layer 605 by a metal organic chemical vapor deposition process or molecular beam epitaxy process. In the present embodiment, the group IV atom can be a silicon atom. The silicon precursor in the metal organic chemical vapor deposition equipment can be silane (SiH4) or disilane (Si2H6). The n-type conductive layer 607 is manufactured by initially forming a gallium nitride (GaN) layer doped with highly concentrated silicon or an aluminum gallium nitride (AlGaN) doped with highly concentrated silicon, and then forming a gallium nitride layer doped with low concentrated silicon or an aluminum gallium nitride doped with low concentrated silicon. The gallium nitride layer doped with highly concentrated silicon or the aluminum gallium nitride doped with highly concentrated silicon can make the n-type electrodes have better electrical conductivity.

Thereafter, an active layer 609 is formed on the n-type conductive layer 607, wherein the active layer 609 can be a single hetero-structure layer, a double hetero-structure layer, a single quantum well layer, or a multiple quantum well layer. The quantum well layer can be of indium gallium nitride, and the electron-blocking layer can be made of a ternary alloy such as aluminum gallium nitride. Further, a quaternary alloy such as AlxInyGa1-x-yN can be used for formation of the quantum well layer and the electron-blocking layer, wherein the electron-blocking layer with a wide band gap and the quantum well layer with a narrow band gap can be obtained by adjusting the concentrations of aluminum and indium in the aluminum indium gallium nitride. The active layer 609 can be doped with an n-type or p-type dopant, or can be doped with an n-type and p-type dopants simultaneously, or can include no dopants. In addition, the quantum well layer can be doped and the electron-blocking layer can be not doped; the quantum well layer can be not doped and the electron-blocking layer can be doped; both the quantum well layer and the electron-blocking layer can be doped; or neither the quantum well layer nor the electron-blocking layer can be doped. Further, a portion of the quantum well layer can be delta-doped.

Next, a p-type conductive electron-blocking layer 611 is formed on the active layer 609. The p-type conductive electron-blocking layer 611 may comprise a first Group III-V semiconductor layer and a second Group III-V semiconductor layer. The first and second Group III-V semiconductor layers can have two different band gaps, and are periodically and repeatedly deposited on the active layer 609. The periodic and repeated deposition process can form an electron-blocking layer 611 having a wider band gap, which is higher than that of the active layer, so as to block excessive electrons overflowing from the active layer 609. The first Group III-V semiconductor layer can be an aluminum indium gallium nitride (AlxInyGa1-x-yN) layer. The second Group III-V semiconductor layer can be an aluminum indium gallium nitride (AluInvGa1-u-vN) layer, wherein $0 \leq x \leq 1$, $0 \leq y \leq 1$, $x+y \leq 1$, $0 \leq u \leq 1$, $0 \leq v \leq 1$, and $u+v \leq 1$. When x is equal to u, y is not equal to v. Further, the first and second Group III-V semiconductor layers can be of gallium nitride (GaN), aluminum nitride (AlN), indium nitride (InN), aluminum gallium nitride (AlGaN), indium gallium nitride (InGaN), or aluminum indium nitride (AlInN).

Finally, a Group II atom can be doped to form a p-type conductive layer 613 on the electron-blocking layer 611. In the present embodiment, the Group II atom can be a magnesium atom. The magnesium precursor in the metal organic chemical vapor deposition equipment can be CP2Mg. The p-type conductive layer 613 can be manufactured by initially forming a gallium nitride layer doped with low concentrated magnesium or an aluminum gallium nitride doped with low concentrated magnesium, and then forming a gallium nitride layer with highly concentrated magnesium or an aluminum gallium nitride doped with highly concentrated magnesium. The gallium nitride layer doped with highly concentrated magnesium or the aluminum gallium nitride doped with highly concentrated magnesium can provide p-type electrodes with better electrical conductivity.

Figure 6D:
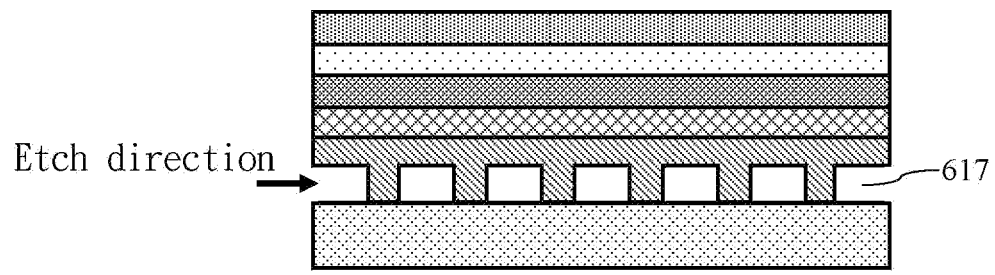

As shown in Step 4-5 of FIG. 4 and FIG. 6D, the patterned silicon dioxide layer 603 is removed so that a groove pattern layer having a plurality of grooves 617 is formed on the groove filling/buffer layer 605 and adjacent to the substrate 601. In one embodiment of the present invention, the silicon dioxide layer can be removed by a wet chemical etch process. Etchant that is able to react with oxide is selected and prepared at a suitable concentration. The silicon dioxide layer 603 is immersed in the etchant, which reacts with the silicon dioxide so as to remove the silicon dioxide layer 603. After the removal of the silicon dioxide layer, a pillar-like Group nitride layer remains and is attached to the substrate.

The silicon dioxide layer can be immersed in the etchant with the application of ultrasonic power and UV radiation, and with the increase of reaction temperature such that the reaction between the etchant and the silicon dioxide layer can be accelerated. The temperature of the etchant is up to approximately 150 degrees Celsius. Buffered oxide etchant solution (BOE) can be chosen as the etchant for etching silicon dioxide (SiO2) or silicon nitride (Si3N4). The buffered oxide etchant solution is a mixing solution of ammonium fluoride (NH4F) solution and hydrogen fluoride (HF). The preparation method of the buffered oxide etchant solution includes initial preparation of 40% by weight of ammonium fluoride solution, and 40% by weight of ammonium fluoride solution and a solution of 49% HF concentration are blended to prepare 10% by volume of buffered oxide etchant solution. Specifically, 90 grams of granular ammonium fluoride is added to 135 mL of deionized water and then stirred to dissolve. 180 mL of ammonium fluoride solution is transferred to a container using a volumetric flask, and 20 mL of a solution of 49% HF concentration is introduced to the same container. As a result, the buffered oxide etchant solution is obtained. The silicon dioxide layer 603 is immersed in the etchant in a short time. Finally, the silicon dioxide layer 603 is completely removed thereby forming continuous or discontinuous grooves 617 as voids on the groove filling layer 605 and adjacent to the substrate 601.

If another etchant is utilized to etch the surface of the Group III nitride layer, the surface irregularity can be increased so that the light extraction efficiency of the semiconductor layer can be further improved.

Figure 6E:
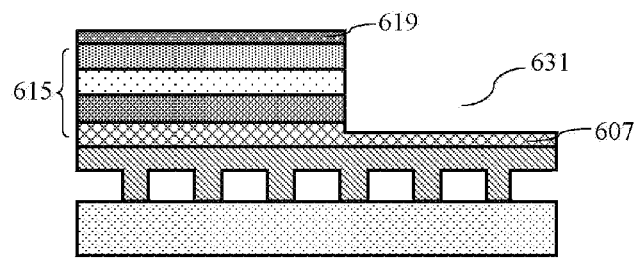

As shown in Step 4-6, Step 4-7, and FIG. 6E, the semiconductor layer 615 is etched to form a cutting region 631. Photoresist is spread to form a photoresist film completely covering the surface of the p-type conductive layer 613 by centrifugal force caused by a spin coater. The photoresist film is patterned by photolithography to form a mask exposing the portions to be etched. Then, a wet etch, dry etch, or an etch method using inductively coupled plasma etcher is applied to perform a mesa process. The mesa process is performed to etch the semiconductor layer 615 so as to form a cutting region 631 and simultaneously to expose the n-type conductive layer 607.

A transparent electrically conductive layer 619 is then formed on the semiconductor layer 615. The transparent electrically conductive layer 619 can be formed on the semiconductor layer 615 using an evaporation deposition, sputtering deposition, or physical vapor deposition process. The transparent electrically conductive layer 619 may comprise nickel gold, indium tin oxide, indium zinc oxide, indium tungsten oxide, or indium gallium oxide.

In an alternative embodiment, a transparent electrically conductive layer 619 can be formed on the semiconductor layer 615, and the transparent electrically conductive layer 619 and the semiconductor layer 615 are partially etched to form the cutting region 631.

Figure 6F:
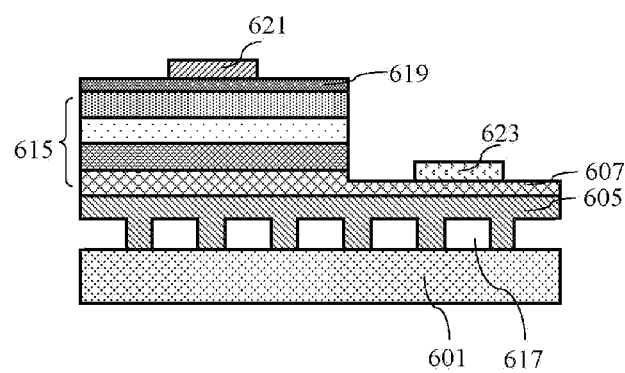
Figure 6F:
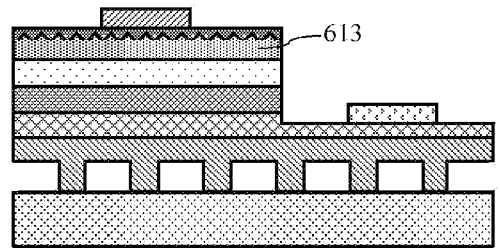
Figure 6G:
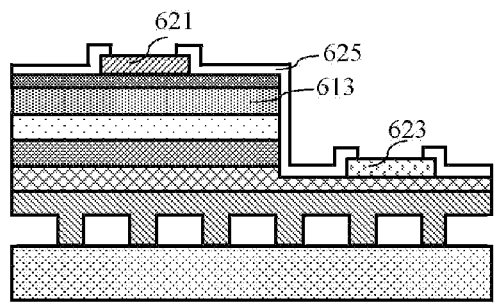
Figure 6G:
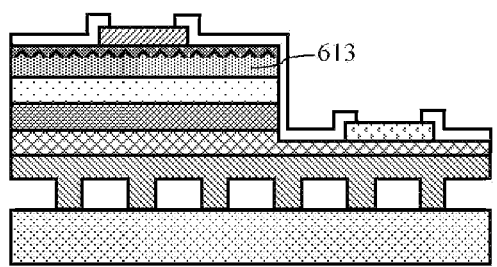

Following Step 4-7, as shown in FIGS. 6F and 6G, an n-type electrode 623 is formed on the n-type conductive layer 607, and a p-type electrode 621 is formed on the transparent electrically conductive layer 619 by general processes for manufacturing general light emitting diodes. The n-type electrode 623 and the p-type electrode 621 can be formed by depositing metal on the n-type conductive layer 607 and the transparent electrically conductive layer 619 using a physical evaporation deposition process such as a sputtering deposition process or an evaporation deposition process.

The n-type electrode 623 may comprise titanium/aluminum/titanium/gold, chrome-gold alloy, or lead-gold alloy. The p-type electrode 621 may comprise nickel gold alloy, platinum gold alloy, tungsten, chrome-gold alloy, or palladium.

Finally, as shown in FIG. 6G, an insulating layer 625 for protecting the semiconductor device can be formed to enclose the semiconductor optoelectronic structure while exposing the n-type electrode 623 and the p-type electrode 621. The insulating layer comprises silicon dioxide, epoxy, silicon nitride, titanium dioxide, or aluminum nitride.

Referring to FIGS. 6F' and 6G', before the formation of the transparent electrically conductive layer 619, an additional wet etch process, dry etch process, or etch method using an inductively coupled plasma etcher can be performed to roughen the surface of the p-type conductive layer 613. After the rough surface is formed, the subsequent step for forming the transparent electrically conductive layer 619 can be continued.

Figure 7A:
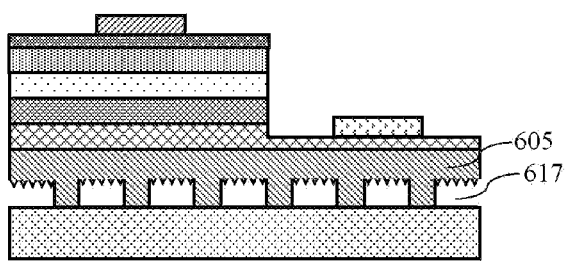
FIGS. 7A to 7B and 7A' to 7B' are cross-sectional views showing the steps of a first manufacturing method for another structure according to one embodiment of the present invention.
Figure 7B:
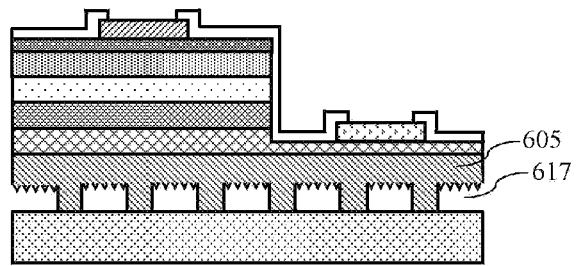
Figure 7A:
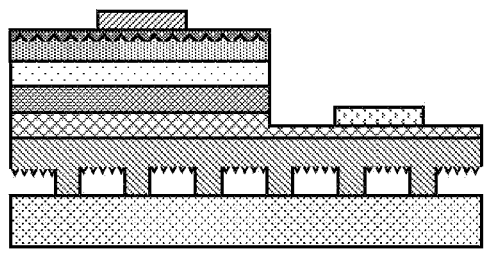
Figure 7B:
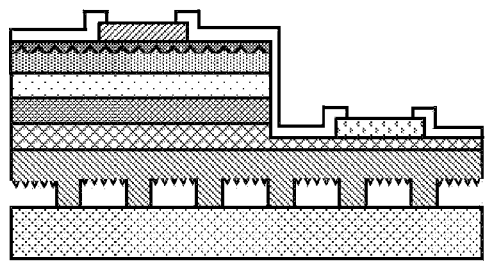

Referring to FIGS. 7A, 7A', 7B, and 7B', the bottom surface of the plural grooves 617 can be roughened for increasing the light extraction efficiency of the semiconductor optoelectronic structure. After continuous grooves 617 as shown in FIG. 6D are formed by removing the silicon dioxide layer, a second wet etch process can be performed for forming a rough surface on the groove filling layer 605. The second wet etch process introduces etchant into the semiconductor optoelectronic structure via the continuous grooves 617 for etching the surface of the Group III nitride groove filling layer 605. The etchant can be potassium hydroxide (KOH) solution, sulfuric acid (H2SO4) solution or phosphoric acid (H3PO4) solution. During the second etch process, ultrasonic power and UV radiation energy can be used, and the temperature of the etchant is increased for accelerating the reaction between the etchant and the Group III nitride groove filling layer 605, resulting in finishing the reaction in several seconds. The sequent process steps are similar to those for manufacturing the embodiments shown in FIGS. 6E and 6F. Therefore, the descriptions of the process steps are not repeated here.

Figure 5:
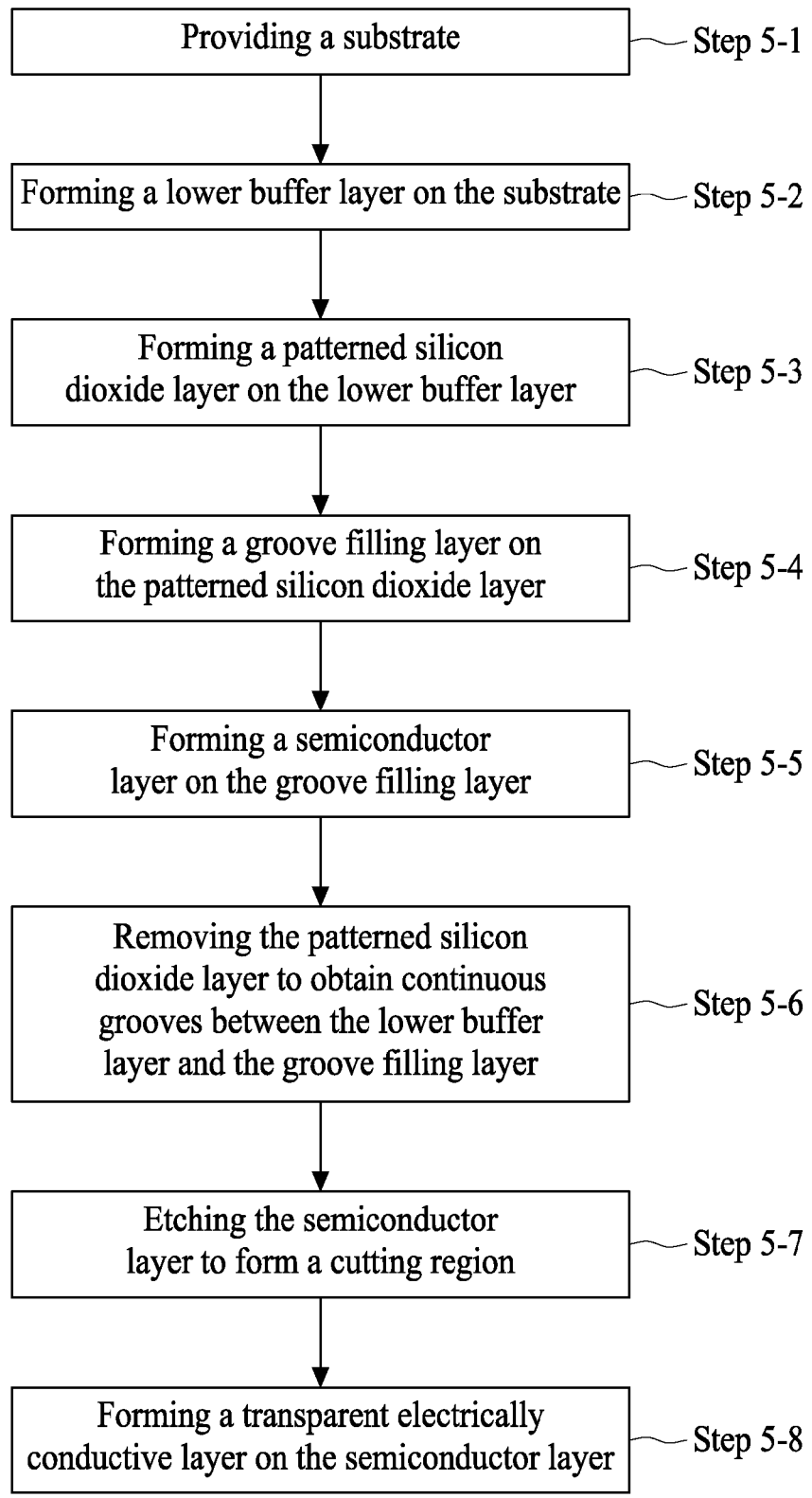
FIG. 5 is a flow chart showing the steps of a fabrication method according the second embodiment of the present invention.

FIG. 5 is a flow chart showing the steps of a fabrication method according the second embodiment of the present invention. FIGS. 8A to 8E are cross-sectional views showing the steps of a second manufacturing method for a semiconductor optoelectronic structure with increased light extraction efficiency according to one embodiment of the present invention. Because Step 5-1 is similar to Step 4-1, detailed description is not repeated.

Figure 8A:
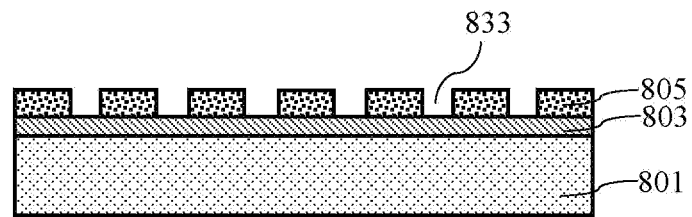
FIGS. 8A to 8G and 8F' to 8G' are cross-sectional views showing the steps of a second manufacturing method for a semiconductor optoelectronic structure with increased light extraction efficiency according to one embodiment of the present invention.

As shown in Step 5-2 and FIG. 8A, a lower buffer layer 803 is formed on a substrate 801 by a metal organic chemical vapor deposition process or molecular beam epitaxy process. The lower buffer layer 803 can be Al$_x$In$_y$Ga1-x-yN where $0 \leq x \leq 1$ and $0 \leq y \leq 1$.

As shown in Step 5-3 and in FIG. 8A, a patterned silicon dioxide layer 805 is formed on the lower buffer layer 803 by depositing silicon dioxide on the substrate using a chemical vapor deposition process or a low temperature sputtering deposition process. Next, a patterned photoresist film is formed on the surface of the silicon dioxide layer 805, exposing the portions to be etched. Finally, a wet etch, dry etch, or an etch method using inductively coupled plasma etcher is applied to obtain a patterned silicon dioxide layer 805. The patterned silicon dioxide layer 805 can have a continuous pattern or a partially continuous pattern, which can include plural cylindrical grooves as shown in FIG. 10A, a plural hexagonal columnar grooves as shown in FIG. 10B, square prism-shaped grooves as shown in FIG. 10C, and elongated grooves as shown in FIG. 10D. The patterns of FIGS. 10A to 10C are continuous, while the pattern of FIG. 10D is partially continuous.

Figure 8B:
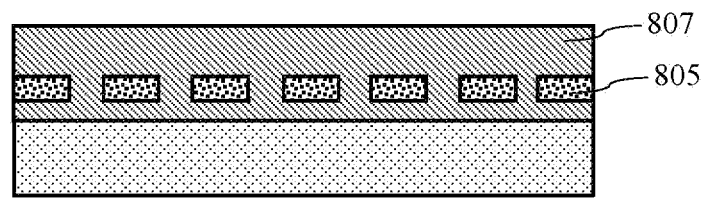

As shown in Step 5-4 and in FIG. 8B, a Group III nitride groove filling layer/upper buffer layer 807 is formed on the patterned silicon dioxide layer 805. Due to lattice mismatch, discontinuous gaps may be formed between the Group III nitride groove filling layer/upper buffer layer 807 and the silicon dioxide layer 805 during an epitaxial process. When the Group III nitride material growing from cavities 833 using chemical vapor deposition process reaches the surface of the silicon dioxide layer, the Group III material may grow laterally and join together to form a planar groove filling layer/upper buffer layer 807. The filling layer can be a buffer layer for increasing the epitaxial quality of a semiconductor layer. The Group III groove filling layer 807 can be Al$_x$In$_y$Ga1-x-yN where $0 \leq x \leq 1$ and $0 \leq y \leq 1$.

Figure 8C:
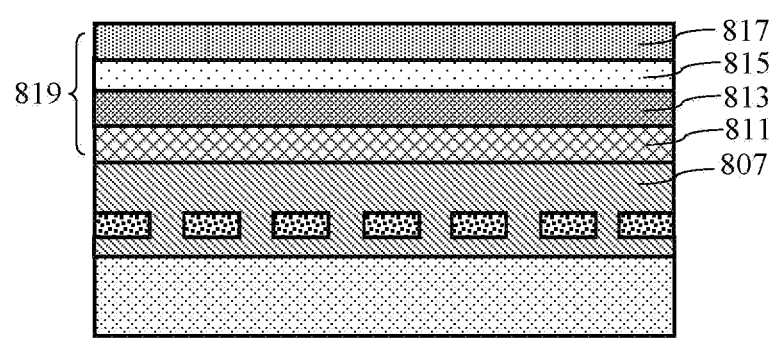

As shown in Step 5-5 and FIG. 8C, a semiconductor layer 819 including an n-type conductive layer 811, an active layer 813, an electron-blocking layer 815 and a p-type conductive layer 817 is formed on the groove filling layer 807 by a metal organic chemical vapor deposition process or molecular beam epitaxy process.

The material used and manufacturing steps adopted for forming the n-type conductive layer 811, the active layer 813, the electron-blocking layer 815 and the p-type conductive layer 817 are similar to those for forming the n-type conductive layer 607, the active layer 609, the electron-blocking layer 611, and the p-type conductive layer 613 described in Step 4-4. Thus, details are not repeated here.

Figure 8D:
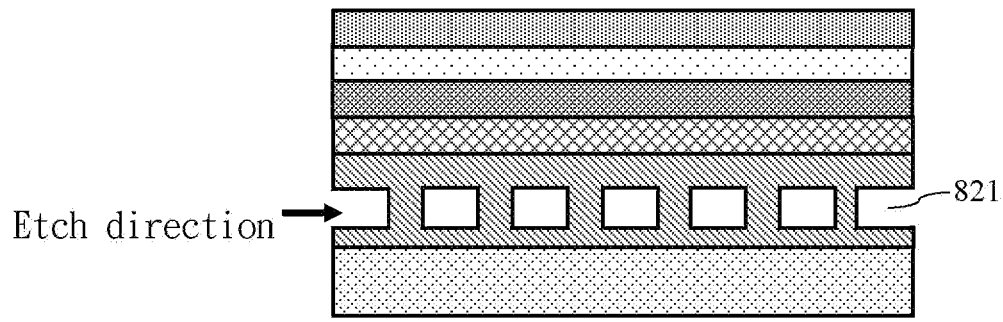

As shown in Step 5-6 and FIG. 8D, the patterned silicon dioxide layer 805 is removed so that a groove pattern layer having a plurality of grooves 821 can be formed as voids between the groove filling/upper buffer layer 807 and the lower buffer layer 803. The patterned silicon dioxide layer 805 can be removed using the similar etchant and processing steps disclosed in the above Step 4-5. Thus, the details are not repeated here.

If another etchant is utilized to etch the surface of the Group III nitride layer 807, the surface irregularity can be increased so that the light extraction efficiency of the semiconductor layer 819 can be further improved.

Figure 8E:
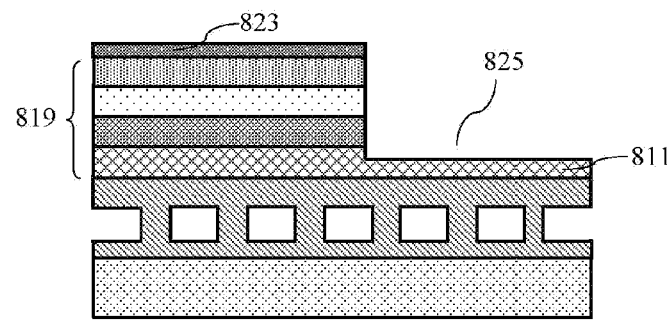

As shown in Step 5-7 and FIG. 8E, the semiconductor layer 819 is etched to form a cutting region 825 using the processes described in the above Step 4-6 and 4-7, and a transparent electrically conductive layer 823 is then formed on the semiconductor layer 819 using an evaporation deposition, sputtering deposition, or physical vapor deposition process as shown in Step 5-8, wherein the transparent electrically conductive layer may comprise nickel gold, indium tin oxide, indium zinc oxide, indium tungsten oxide, or indium gallium oxide.

Alternatively, a transparent electrically conductive layer 823 is formed on the semiconductor layer 819, and a cutting region 825 is then etched to expose the n-type conductive layer by lithography and mesa processes.

Figure 8F:
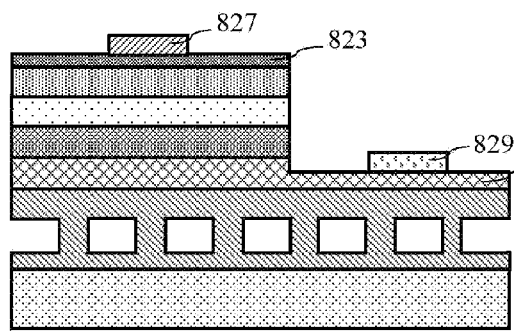
Figure 8F:
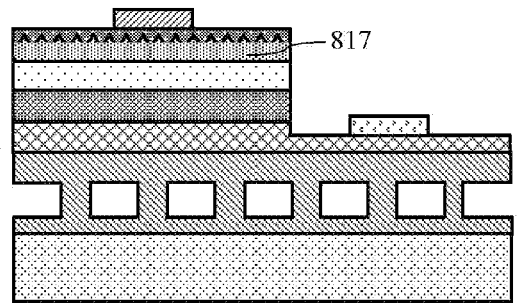
Figure 8G:
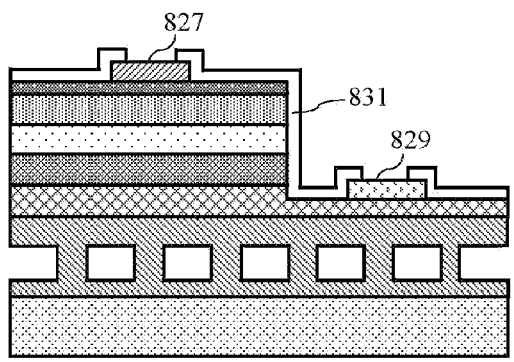
Figure 8G:
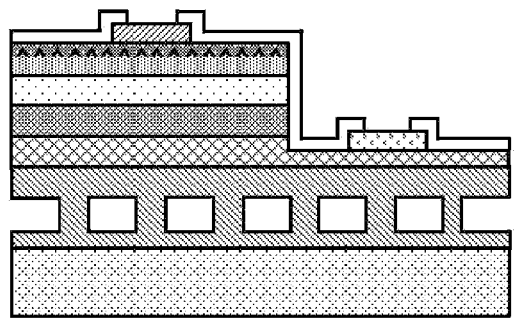

Referring to FIGS. 8F and 8G, an n-type electrode 829 and a p-type electrode 827 can be separately formed on the n-type conductive layer 811 and the transparent electrically conductive layer 823 by depositing metal, using a physical evaporation deposition process such as a sputtering deposition process or an evaporation deposition process. The n-type electrode 829 may comprise titanium/aluminum/titanium/gold, chrome-gold alloy, or lead-gold alloy. The p-type electrode 827 may comprise nickel gold alloy, platinum gold alloy, tungsten, chrome-gold alloy, or palladium.

Finally, as shown in FIG. 8G, an insulating layer 831 can be formed to enclose the semiconductor optoelectronic structure while exposing the n-type electrode 829 and the p-type electrode 827. The insulating layer comprises silicon dioxide, epoxy, silicon nitride, titanium dioxide, or aluminum nitride.

In addition, the differences between the structure of FIG. 8F and the structure of FIG. 8F' and between the structure of FIG. 8G and the structure of FIG. 8G' are that the p-type conductive layer 817 has a rough surface. After the patterned silicon dioxide layer in the structure of FIG. 8D is removed, the surface of the p-type conductive layer 817 is etched to form an irregular surface using a wet etch process, a dry etch process, or an etch method using an inductively coupled plasma etcher. After the surface is roughened, the subsequent steps of FIGS. 8E and 8F are continued.

Figure 9A:
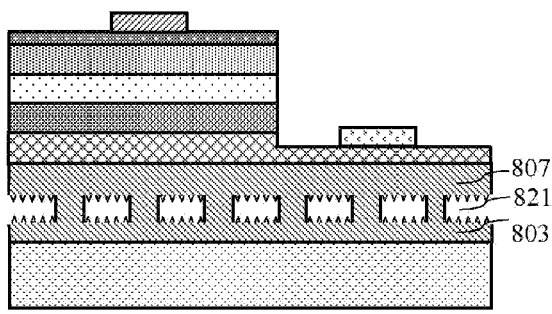
FIGS. 9A to 9C and 9A' to 9B' are cross-sectional views showing the steps of a second manufacturing method for another structure according to one embodiment of the present invention.
Figure 9A:
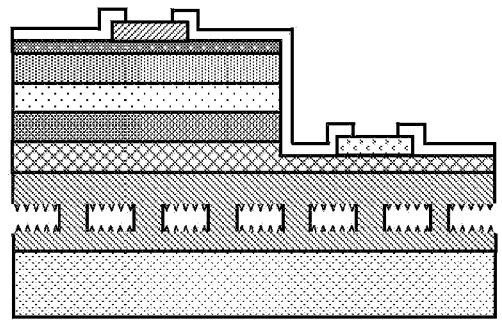
Figure 9B:
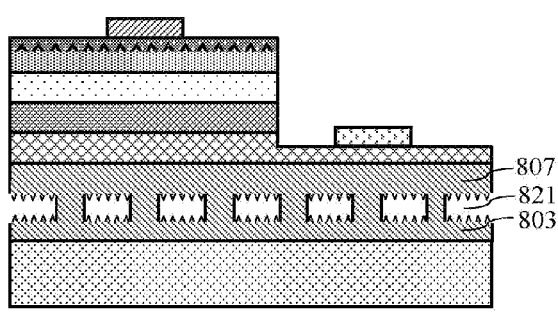
Figure 9B:
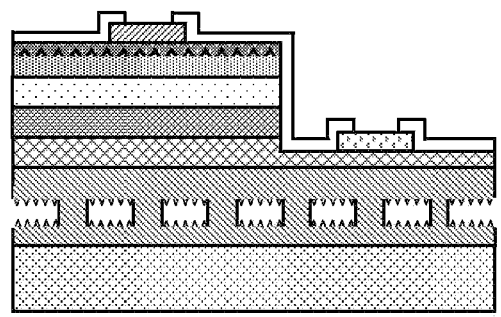

In addition to the second method of the above embodiment of the present invention for manufacturing the four structures in FIGS. 8F, 8F', 8G, and 8G', the present invention provides another method for manufacturing other structures such as those in FIGS. 9A, 9A', 9B, and 9B'. The difference between the method for manufacturing the four structures in FIGS. 8F, 8F', 8G, and 8G' and the method for manufacturing the structures such as those in FIGS. 9A, 9A', 9B, and 9B' is that after the first wet etch for removing silicon dioxide layer 805 to form continuous grooves 821 as shown in FIG. 8D is finished, a second wet etch process is moreover performed for roughening the surfaces of the lower buffer layer 803 and the upper buffer layer/groove filling layer 807, thereby increasing the light extraction efficiency of the semiconductor optoelectronic structure. The second wet etch process introduces etchant, such as KOH solution, H2SO4 solution or H3PO4 solution, into the semiconductor optoelectronic structure via the continuous grooves 821 for etching the surfaces of the lower buffer layer 803 and the upper buffer layer/groove filling layer 807 so as to obtain rough surfaces. During the second etch process, ultrasonic power and UV radiation energy can be used, and the temperature of the etchant is increased for accelerating the reaction between the etchant and the Group III nitride groove filling layer 807, resulting in finishing the reaction in several seconds. The subsequent process steps are similar to those for manufacturing the embodiments shown in FIGS. 8E and 8F. Therefore, the descriptions of the process steps are not provided here.

Figure 9C:
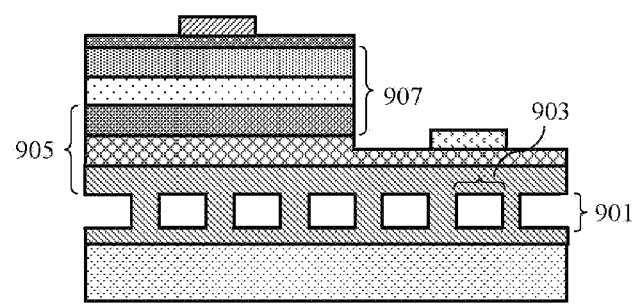

As shown in FIG. 9C, the continuous grooves formed by the above-mentioned method steps may have a height 901 of from 0.05 to 2 micrometers, and a width 903 of from 0.1 to 10 micrometers. The distance 905 of the active layer and the continuous grooves is from approximately 3 to 4 micrometers, facilitating the reflection of the light from the active layer by the surface of the continuous grooves, and enhancing the luminous intensity of the light output surface. In addition, the active layer and the surface of the p-type conductive layer are separated by a distance 907 of 0.15 to 3 micrometers, and such a distance facilitates the light from the active layer to pass through the light output surface.

The above-described embodiments of the present invention are intended to be illustrative only. Numerous alternative embodiments may be devised by persons skilled in the art without departing from the scope of the following claims.

What is claimed is:

1. A semiconductor light emitting structure, comprising:
   a substrate;
   a buffer layer formed on the substrate, comprising a pattern having a plurality of grooves as voids, wherein each groove of the plurality of grooves extends downwardly reaching the substrate;
   a semiconductor layer formed on the buffer layer, comprising:
      an n-type conductive layer formed on the buffer layer;
      an active layer formed on the n-type conductive layer; and
      a p-type conductive layer formed on the active layer;
   a transparent electrically conductive layer formed on the semiconductor layer;
   a p-type electrode formed on the transparent electrically conductive layer; and
   an n-type electrode formed on the n-type conductive layer;
   wherein inner surfaces of the buffer layer forming interfaces of the buffer layer with upper main surfaces of the plurality of grooves have a roughness capable of increasing light extraction efficiency of light emitted by the active layer.

2. The semiconductor light emitting structure of claim 1, wherein a surface of the p-type conductive layer is rough.

3. The semiconductor light emitting structure of claim 1, wherein the pattern is partially continuous.

4. A semiconductor light emitting structure, comprising:
   a substrate;
   a buffer layer formed on the substrate, said buffer layer comprising a groove pattern having a plurality of grooves, and each groove of the plurality of grooves being voids located inside the groove pattern and separated from the substrate;
   a semiconductor layer formed on the buffer layer, comprising:
      an n-type conductive layer formed on the buffer layer;
      an active layer formed on the n-type conductive layer; and
      a p-type conductive layer formed on the active layer;
   a transparent electrically conductive layer formed on the semiconductor layer;

a p-type electrode formed on the transparent electrically conductive layer; and an n-type electrode formed on the n-type conductive layer;

wherein inner surfaces of the buffer layer forming interfaces of the buffer layer with upper main surfaces of the plurality of grooves have a roughness capable of increasing light extraction efficiency of light emitted by the active layer.

5. The semiconductor light emitting structure of claim 4, wherein a surface of the p-type conductive layer is rough.

6. The semiconductor light emitting structure of claim 4, wherein the groove pattern is partially continuous.

7. The semiconductor light emitting structure of claim 4, wherein the buffer layer comprises a lower buffer layer and an upper buffer layer connected with the lower buffer layer, and the plurality of grooves being formed between the lower buffer layer and the upper buffer layer.

8. The semiconductor light emitting structure of claim 1, wherein the semiconductor layer defines a cutting region therein to expose a portion of the n-type conductive layer.

9. The semiconductor light emitting structure of claim 1, wherein each groove of the plurality of grooves has a height in a range from 0.05 to 2 microns, and a width in a range from 0.1 to 10 microns.

10. The semiconductor light emitting structure of claim 1, wherein a distance between the active layer and the plurality of grooves is in a range from 3 to 4 microns.

11. The semiconductor light emitting structure of claim 1, wherein a distance between the active layer and the p-type conductive layer is in a range from 0.15 to 3 microns.

12. The semiconductor light emitting structure of claim 1, wherein the buffer layer is made of $Al_xIn_yGa_{1-x-y}N$, and wherein $0 \leq x \leq 1$, and $0 \leq y \leq 1$.

13. The semiconductor light emitting structure of claim 1, further comprising a p-type conductive electron-blocking layer sandwiched between the active layer and the p-type conductive layer.

14. The semiconductor light emitting structure of claim 1, wherein the substrate is selected from the group consisting of a sapphire substrate, a silicon carbide substrate, a lithium aluminate substrate, a lithium gallate substrate, a silicon substrate, a gallium nitride substrate, a zinc oxide substrate, an aluminum zinc oxide substrate, a gallium arsenide substrate, a gallium phosphide substrate, a gallium antimonide substrate, an indium phosphide substrate, an indium arsenide substrate, and a zinc selenide substrate.

* * * * *